(12) United States Patent
Dinger et al.

(10) Patent No.: US 6,577,443 B2
(45) Date of Patent: Jun. 10, 2003

(54) REDUCTION OBJECTIVE FOR EXTREME ULTRAVIOLET LITHOGRAPHY

(75) Inventors: Udo Dinger, Oberkochen (DE); Hans-Jürgen Mann, Oberkochen (DE)

(73) Assignee: Carl-Zeiss Stiftung, Heidenheim (DE)

( * ) Notice: Subject to any disclaimer, the term of this patent is extended or adjusted under 35 U.S.C. 154(b) by 0 days.

(21) Appl. No.: 09/878,697

(22) Filed: Jun. 11, 2001

(65) Prior Publication Data

US 2002/0114089 A1 Aug. 22, 2002

Related U.S. Application Data

(63) Continuation-in-part of application No. 09/322,813, filed on May 28, 1999, now Pat. No. 6,244,717.

(30) Foreign Application Priority Data

May 30, 1998 (DE) .......................... 193 24 442

(51) Int. Cl.[7] .................. G02B 5/10; G02B 17/00; G03B 27/54; G21K 5/00
(52) U.S. Cl. .................. 359/366; 359/731; 359/859; 359/861; 359/900; 359/351; 359/359; 378/34; 378/35; 355/67
(58) Field of Search .................. 359/365, 366, 359/730, 731, 859, 861, 900, 350, 351, 355, 359; 355/60, 67, 71; 378/34, 35

(56) References Cited

U.S. PATENT DOCUMENTS

| | | | |
|---|---|---|---|
| 2,970,518 A | | 2/1961 | Ross |
| 3,454,338 A | * | 7/1969 | Girard et al. |
| 3,748,015 A | | 7/1973 | Offner |
| 4,241,390 A | * | 12/1980 | Markle et al. |
| 4,655,592 A | * | 4/1987 | Allemand |
| 4,798,450 A | * | 1/1989 | Suzuki |
| 4,804,258 A | | 2/1989 | Kebo |

(List continued on next page.)

FOREIGN PATENT DOCUMENTS

| | | |
|---|---|---|
| EP | 422 853 B1 | 4/1991 |
| EP | 480 617 A2 | 4/1992 |
| EP | 903 605 A2 | 3/1999 |
| JP | 07-283116 | 10/1995 |

OTHER PUBLICATIONS

European Patent Office Search Report, Application No. 99 110 265, dated Aug. 30, 1999.

Jewell "Reflective systems design study for soft x-ray projection lithography." Journal of Vaccum Science & Technology B vol. 8, No. 6, pp. 1519–1523 (Nov./Dec. 1990).

Jewell "Optical system design issues in development of projection camera for EUV lithography." SPIE vol. 2437, pp. 340–346 (Feb. 1995).

Korsch, D., *Reflective Optics*, "3.3 Paraxial Relations and Definitions" pp. 38–43, 1991.

Sweeney, et al. "EUV Optical Design for a 100 nm CD Imaging System." 23rd International Symposium of Microlithography, SPIE vol. 3331, pp. 2–10 (Feb. 1998).

*Primary Examiner*—Ricky D. Shafer
(74) *Attorney, Agent, or Firm*—Marshall, Gerstein & Borun

(57) ABSTRACT

A reduction objective, a projection exposure apparatus with a reduction objective, and a method of use thereof are disclosed. The reduction objective has a first set of multilayer mirrors in centered arrangement with respect to a first optical axis, a second set of multilayer mirrors in centered arrangement with respect to a second optical axis, and an additional mirror disposed at grazing incidence, such that said additional mirror defines an angle between the first optical axis and said second optical axis. The reduction objective has an imaging reduction scale of approximately 4x for use in soft X-ray, i.e., EUV and UV, annular field projection applications, such as lithography

19 Claims, 8 Drawing Sheets

U.S. PATENT DOCUMENTS

| | | | |
|---|---|---|---|
| 4,861,148 A | | 8/1989 | Sato et al. |
| 5,063,586 A | | 11/1991 | Jewell et al. |
| 5,071,240 A | | 12/1991 | Ichihara et al. |
| 5,136,422 A | * | 8/1992 | Ukon |
| 5,153,898 A | | 10/1992 | Suzuki et al. |
| 5,257,139 A | | 10/1993 | Higuchi |
| 5,307,210 A | * | 4/1994 | MacFarlane et al. |
| 5,315,629 A | | 5/1994 | Jewell et al. |
| 5,353,322 A | | 10/1994 | Bruning et al. |
| 5,361,292 A | | 11/1994 | Sweatt |
| 5,379,157 A | | 1/1995 | Wang |
| 5,410,434 A | | 4/1995 | Shafer |
| 5,459,771 A | | 10/1995 | Richardson et al. |
| 5,619,382 A | * | 4/1997 | Kato et al. |
| 5,686,728 A | * | 11/1997 | Shafer |
| 5,737,137 A | | 4/1998 | Cohen et al. |
| 5,805,365 A | | 9/1998 | Sweatt |
| 5,815,310 A | * | 9/1998 | Williamson |
| 5,896,438 A | | 4/1999 | Miyake et al. |
| 5,956,192 A | | 9/1999 | Williamson |
| 5,973,826 A | | 10/1999 | Chapman et al. |
| 5,995,582 A | * | 11/1999 | Terashima et al. |
| 6,014,252 A | | 1/2000 | Shafer |
| 6,033,079 A | | 3/2000 | Hudyma |
| 6,244,717 B1 | * | 6/2001 | Dinger |
| 6,333,811 B1 | * | 12/2001 | Tatian et al. |
| 6,353,470 B1 | * | 3/2002 | Dinger |

* cited by examiner

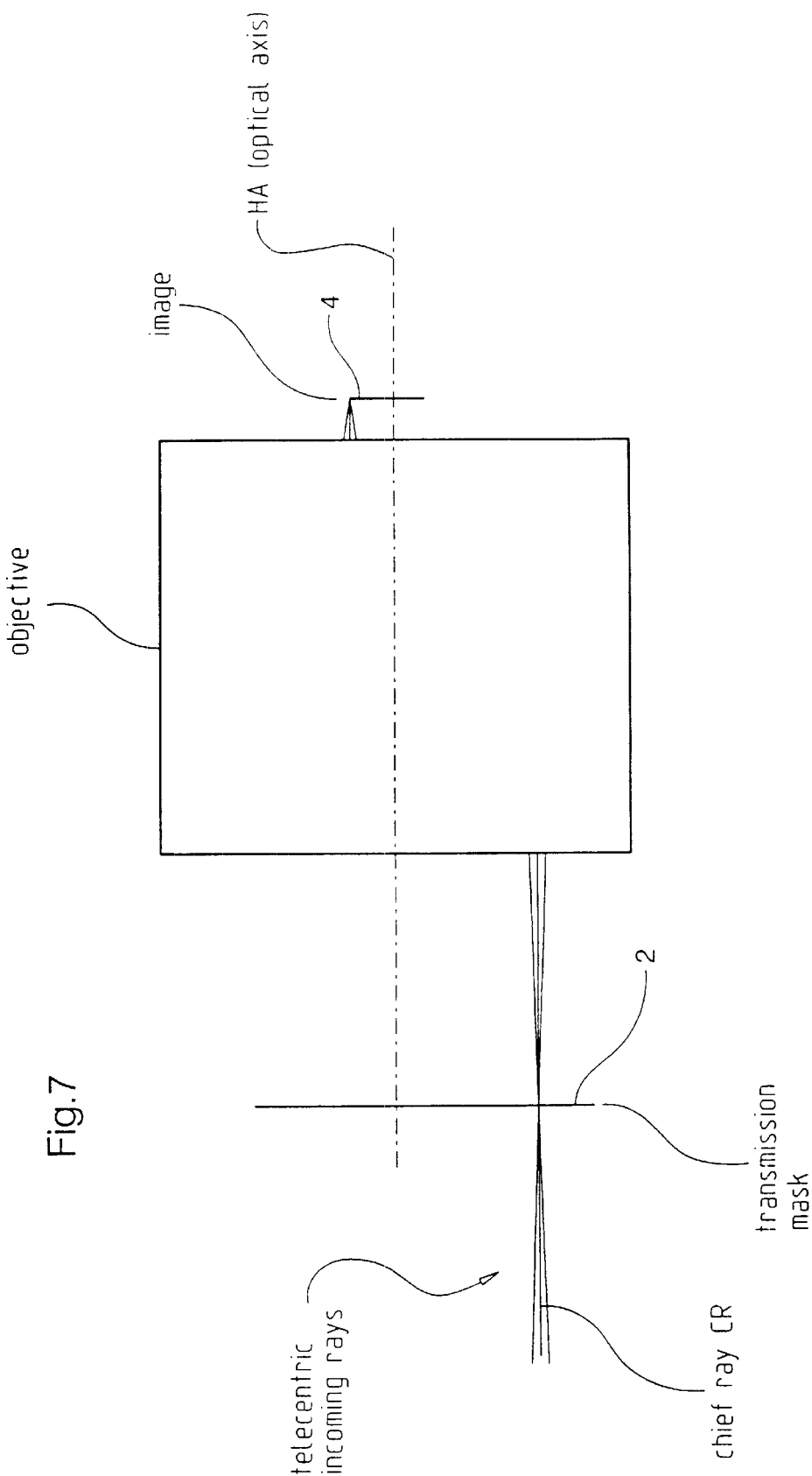

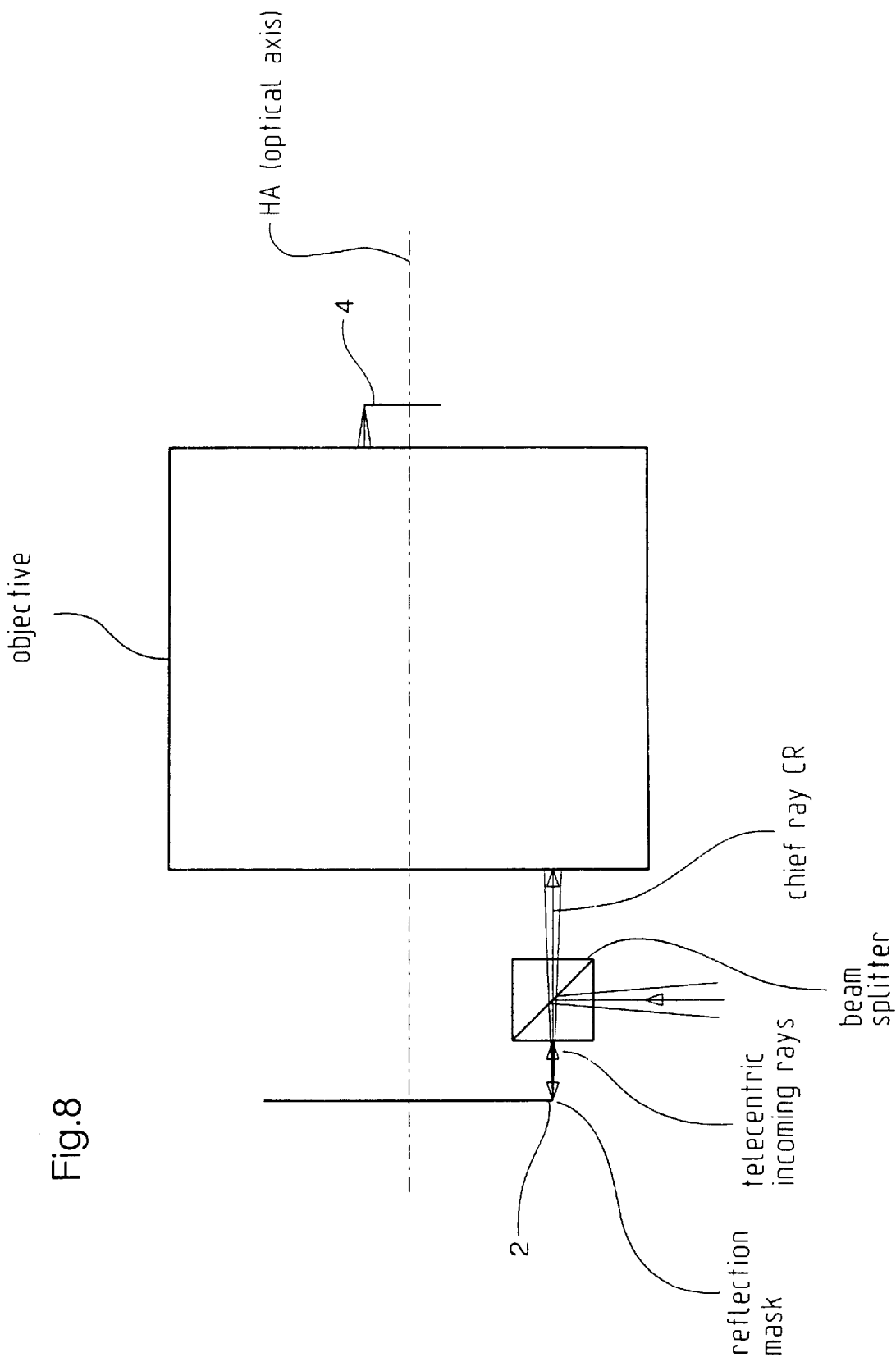

REDUCTION OBJECTIVE FOR EXTREME ULTRAVIOLET LITHOGRAPHY

This is a continuation-in-part of U.S. application Ser. No. 09/322,813, filed May 28, 1999, now U.S. Pat. No. 6,244,717.

FIELD OF THE INVENTION

The invention relates to a reduction objective, a projection exposure apparatus, and method of use thereof for exposing patterned information onto a reduced image plane for use in lithography applications, such as integrated circuit fabrication.

BACKGROUND OF THE INVENTION

The desirability of creating lithography systems which operate with incident light wavelengths below 193 nm to achieve imaging structures or patterns with resolution below 130 nm has been established. In fact, there has been a need for lithography systems using soft X-ray, or so called extreme ultraviolet (EUV), wavelength incident light, such as $\lambda=11$ nm or $\lambda=13$ nm light, to obtain image resolution in the below 100 nm range. The resolution of a lithography system is described by the following equation:

$$RES = k_1 \cdot \lambda / NA$$

where $k_1$ is a specific parameter of the lithography process, $\lambda$ is the wavelength of the incident light and NA is the numerical aperture of the system on the image side. This equation can be used to establish design criteria for soft X-ray lithography systems. Thus, for a numerical aperture of 0.10, the imaging of 100 rim structures with 13 nm radiation requires a process with $k_1=0.77$. Alternatively, with $k_1=0.64$, which occurs with 11 nm radiation, imaging of 70 nm structures is possible with a numerical aperture of 0.10.

For lithography imaging systems in the soft X-ray region, multilayer coated reflective systems, such as Distributed Bragg Reflectors (DBRs) and mirrors, are used as optical components. These multilayer systems employ alternating layers of different indices of refraction. The particular multilayer reflective system depends on the wavelength of incident light used. For example, with incident light of $\lambda=11$ nm alternating layers of Mo/Be are preferred and with incident light of $\lambda=13$ nm Mo/Si layers are used. In the case of projection objectives used in soft X-ray or EUV microlithography, the reflectivity of these multilayer systems is approximately 70%. It is, therefore, desirable to use as few optical components in the projection objective as possible to ensure sufficient light intensity at the image. With high intensity light, four-mirror projection objective systems were found to be useful in correcting imaging errors at NA=0.10.

Other requirements for soft X-ray projection objectives, in addition to using a limited number of multilayer reflectors, relate to obscuration, image field curvature, distortion, telecentricity on both the image and the object side, free working distance, and aperture stop positioning and accessibility. Obscurations, for example the central obscuration apparent in Schwarzschild systems, create intolerable degradation in image quality. If an obscuration-free light path is required, then, in the case of centered systems, an off-axis image field must be used. In order to provide image formats of $26\times34$ mm$^2$ or $26\times52$ mm$^2$, it is advantageous to design the projection objective system as an annular field scanner. In such systems, the useful secant length of the scanning slit should be at least 26 mm, and the annular width should lie in the range of 0.5 mm to 2 mm in order to make uniform illumination and illumination-control and dose-control possible.

Regarding distortion, a distinction between static and dynamic or scan distortion is made. Scan distortion is the effective distortion which is obtained by integration of the static distortion over the scanning path. The limits for magnification-corrected, static distortion follow essentially from the specifications for contrast and CD variation.

Image-side telecentricity is also desired in soft X-ray lithography systems. Whether telecentricity is possible on the object side depends on the type of projection application used. If the projection system uses a reflection mask, then a telecentric optical path on the object side is not possible. If transmission masks, for example stencil masks, are used then a telecentric optical path on the object side can be realized.

In order to enable clean limitations of the beam, the aperture stop should be physically accessible. The image-side telecentricity requirement, referred to above, means that the entrance pupil of the last mirror would lie in or near its focal point. In order to obtain a compact design and maintain an accessible aperture stop, it is recommended that a beam-limiting element be placed before the last mirror. This, preferably, results in the place of the beam-limiting element at the third mirror.

Four-mirror projection or reduction objectives have become known from the following publications:

U.S. Pat No. 5,315,629

EP 480,617

U.S. Pat. No. 5,063,586

EP 422,853

Donald W. Sweeney, Russ Hudyma, Henry N. Chapman, David Shafer, EUV optical Design for a 100 mm CD Imaging System, 23rd International Symposium of microlithography, SPIE, Santa Clara, Calif., Feb. 22–27, 1998, SPIE Vol. 3331, p. 2ff.

In U.S. Pat. No. 5,315,629, a four-mirror projection objective with NA=0.1, $4\times31.25\times0.5$ mm$^2$ is claimed. The mirror sequence is concave, convex, concave, concave. From EP 480,617, two NA=0.1, 5x, $25\times2$ mm$^2$ systems have become known. The mirror sequence is concave, convex, arbitrary/convex, concave.

The systems according to U.S. Pat. No. 5,063,586 and EP 422,853 have a rectangular image field, for example, at least $5\times5$ mm$^2$, and use a mirror sequence of convex, concave, convex, concave. These generally decentered systems exhibit very high distortion values. Therefore, the objectives can only be used in steppers with distortion correction on the reticle. However, the high level of distortion makes such objectives impractical in the structural resolution regions discussed here ($\leq 130$ nm).

From U.S. Pat. No. 5,153,898, overall arbitrary three to five-multilayer mirror systems have become known. However, the disclosed embodiments all describe three-mirror systems with a rectangular field and small numerical aperture (NA<0.04). Therefore, the systems described therein can only image structures above 0.25 $\mu$m in length.

Furthermore, reference is made to T. Jewell: "Optical system design issues in development of projection camera for EUV lithography", Proc. SPIE 2437 (1995) and the citations given there, the entire disclosure of which is incorporated by reference.

In the known systems according to EP 480,617 as well as U.S. Pat. No. 5,315,629 and according to Sweeney, cited above, it was found to be disadvantageous that the outside-axially used part of the primary mirror conflicts with the wafer-side sensor structures of a projection exposure installation when not very large free mechanical working distances greater than 100 mm are realized. By using mirror segments which are placed "near the image field", these conflicts occur only at significantly lower distances ($\approx 10$ mm).

Six mirror projection or reduction objectives with all multilayer mirrors in centered arrangement to an optical axis have become known, e.g., from U.S. Pat. No. 6,033,079. The system according to U.S. Pat. No. 6,033,079 is telecentric on the image side. To provide small reflection angles at the object side, i.e., at the reticle, a long distance between the primary multilayer mirror and the reticle according to U.S. Pat. No. 6,033,079 is chosen. A disadvantage of this reduction objective is the extension, or lengthening, of the projection objective in the direction of the optical axis.

Thus, it is desired to provide a projection objective which is suitable for lithography with short wavelengths (at least below 193 nm and, preferably below 100 nm) which does not have the disadvantages of the prior art mentioned above, uses as few optical elements as possible and, yet, has a sufficiently large aperture and fulfills the telecentricity requirements as well as all other requirements for a projection system operating with incident light of wavelengths below 193 nm.

SUMMARY OF THE INVENTION

According to an aspect of the invention, the shortcomings of the prior art are overcome by using a reduction objective that includes four-mirrors (primary, secondary, tertiary, and quaternary). Using this four-mirror system, high transmission efficiency is achieved at wavelengths in the soft x-ray and EUV region with a multilayer mirror system of 70% reflectivity and an aperture in the range of NA≈0.10. The four-mirror objective according to the invention is thus characterized by high resolution, low manufacturing costs and high throughput. In another embodiment a system using six multilayer mirrors is provided.

In both systems a first set of multilayer mirrors is in centered arrangement with respect to a first optical axis and a second set of multilayer mirrors is in centered arrangement with respect to a second optical axis. At least one additional mirror is disposed at grazing incidence between said first and said second set of multilayer mirrors, wherein said additional mirror defines an angle between said first optical axis and said second optical axis.

In a preferred embodiment of the invention, it is provided that an aperture stop lies on or near a mirror, especially on the tertiary mirror. In this embodiment, the aperture stop is physically accessible and the reduction objective is compact and free from vignetting.

In another embodiment of the reduction objective of the invention, the secondary mirror and the quaternary mirror are concave. In still a further embodiment of a four-mirror-system, the four mirrors are arranged in the convex-concave-convex-concave sequence.

The asphericities discussed herein refer to the peak-to-peak or peak-to-valley (PV) deviation A of the aspherical surfaces in comparison to the best fitting sphere in the used region of the mirrors. In the embodiments of the invention discussed herein, these are approximated by a sphere, the center of which lies on the figure-axis of the mirror and the meridional plane of the aspherical element intersects in the upper and lower and point of the used region. The data on the angles of incidence, as provided below in Table II, refer to the angle between the particular incident radiation and the normal to the surface at the point of incidence. The largest angle of incidence of a ray is established by a rim-ray at one of the mirrors.

Preferably, the optically free working distance on the wafer side is 60 mm and the free working distance on the reticle side is at least 100 mm.

As will be appreciated from this disclosure by persons of ordinary skill in the art, the objectives described above can be used not only for soft X-ray lithography, but for other wavelengths, both in the EUV range and outside of this range, without deviation from the invention. Nonetheless, the invention is preferably used at soft X-ray and EUV wavelengths in the region of 193 nm and below. Wavelengths within this range can be generated using excimer lasers.

In order to achieve a diffraction-limited system, it is preferred that the design part of the rms wave front section of the system is at most $0.07\lambda$. It is further preferred that the reduction objective is designed so that it is telecentric on the image side. In systems with a transmission mask, the projection objective is also designed to be telecentric on the object side. In projection systems which are operated with a reflection mask, a telecentric beam path without illumination over a beam splitter which reduces transmission greatly, such as is shown in JP-A-95/28 31 16, is not possible on the object side. Therefore, the chief ray angle in the reticle is chosen so that shading-free illumination, that is no obscuration, is possible. Overall, the telecentricity error on the wafer should not exceed 10 mrad, and preferably is in the 5 mrad to below 2 mrad range. This ensures that the change in the image scale or distortion lies within tolerable limits in the depth of field.

In a preferred embodiment of the invention, the first set of multilayer mirrors comprises four mirrors and the second set of multilayer mirrors comprises two mirrors. The grazing-incidence mirror is arranged in such a way that the first and the second optical axis are parallel to each other. Such an embodiment provides for a short projection objective in axial direction and for small reflection angles at the object side.

According to another aspect of the invention, the reduction objective is used with a mask and a soft X-ray or EUV exposure source, for example, in a projection exposure apparatus, such as those used in lithography for integrated circuit fabrication. In the embodiment, the projection exposure apparatus has a reflection mask and, in an alternative embodiment, it has a transmission mask.

The projection exposure apparatus is preferably designed as an annular-field scanner illuminating an off-axis annular field. 10Advantageously, it is provided that the secant length of the scanning slit is at least 26 mm and that the annular width is greater than 0.5 mm, so that uniform illumination is made possible.

Another advantage of the objective of the invention, is that the asphericity of the aspherical optical elements is small enough so that the system requirements of being "diffraction-limited" and having high reflectivity multilayer mirrors can be achieved, such that the resulting accuracy requirements on these surfaces in all spatial frequency regions from the free diameter of the mirror to atomic dimensions can be obeyed.

According to another aspect of the invention, a method of integrated circuit fabrication using a projection exposure apparatus including a reduction objective is provided. The method comprises the steps of providing a mask, providing a soft X-ray or EUV, illumination source, and providing four mirrors (primary, secondary, tertiary, and quaternary) in centered arrangement with respect to an optical axis, wherein the primary mirror is a convex mirror and the secondary mirror has a positive angular magnification.

Traditionally, approximately 40 pairs of alternating Mo/Si DBR layers are used to create mirrors with high reflectivity of 13 nm wavelength incident light. Similarly, high reflectivity of 11 nm wavelength radiation, requires approximately 70 pairs of Mo/Be alternating layers. By using large numbers of DBR layers, the acceptance angle of mirrors and thus their objective systems is only a few degrees and decreases with increasing angle of incidence. Furthermore, with this increasing angle of incidence, detrimental phase effects can occur. If the test-point-related mean angle of incidence varies greatly over a system surface, then layer packets with changing thickness must be applied. These disadvantages of existing multilayer mirror objective systems are reduced in the present invention in which the objectives have a low mean angle of incidence and a low surface-specific variation around the mean angle of incidence.

The invention will be explained below with the aid of drawings depicting the preferred embodiments.

BRIEF DESCRIPTION OF THE DRAWINGS

FIG. 7 is a depiction of a four-mirror or six-mirror reduction objective that is telecentric on the object side and used with a transmission mask.

FIG. 8 is a depiction of a four-mirror or six-mirror reduction objective that is telecentric on the object side and used with a reflection mask.

DESCRIPTION OF THE PREFERRED EMBODIMENTS

The practical examples identified in FIGS. 2 to 5 are centered reduction systems, telecentric on the image side, with an aperture stop (indicated by AS in FIG. 4, for example) at the third mirror M3. In all systems, the same reference numbers are used for the same components and the following nomenclature is employed:

first (primary) mirror (M1), second (secondary) mirror (M2), third (tertiary) mirror (M3), fourth (quaternary) mirror (M4).

Reduction objectives used in lithography are classified by their primary mirror magnification m(M1), or convergence ratio v(M1)=−1/m(M1), and their secondary-mirror chief ray angular magnification $\mu$(M2). This nomenclature is taken from Dietrich Korsch, Reflective optics, Academic Press, 1991, p. 41 ff, which is incorporated herein by reference. For the different types of primary mirrors Table 1, below, summarizes the different convergence ratio and angular magnification values obtainable.

TABLE I

|  | M1 | v(M1) | $\mu$(M2) |
|---|---|---|---|
| type-a | concave | $\epsilon]1,\infty[$ | $<-\epsilon_4$ |
| type-b | plane, concave | $\epsilon(-1,1]$ | $<-\epsilon_4$ |
| type-e | convex | $\epsilon]-\infty,-1[$ | $<-\epsilon_4$ |
| type-f | convex | $\epsilon]-\infty,-1[$ | $\epsilon]\epsilon_4,1-\epsilon_2[$ |
| type-g | convex | $\epsilon]-\infty,-1[$ | $\epsilon]1+\epsilon_3,\infty[$ |

The following is true for these systems: $\epsilon_i>0$ increases with the numerical i6, 1aperture NA of the system, that is, $\epsilon_i=0 \rightarrow$ NA=0. A schematic representation of the system classification as used below is shown in FIG. 1.

The concept of the chief ray angular magnification or angular magnification refers to the tangents of the chief ray (see Korsch, Reflective Optics, incorporated by reference above). A positive angular magnification means that the slopes of the straight lines identifiable with the incident and reflected chief rays to the optical axis have the same sign, that is, that the entrance and exit pupils of the respective mirror lie on the same physical side of the mirror.

Figure 1:
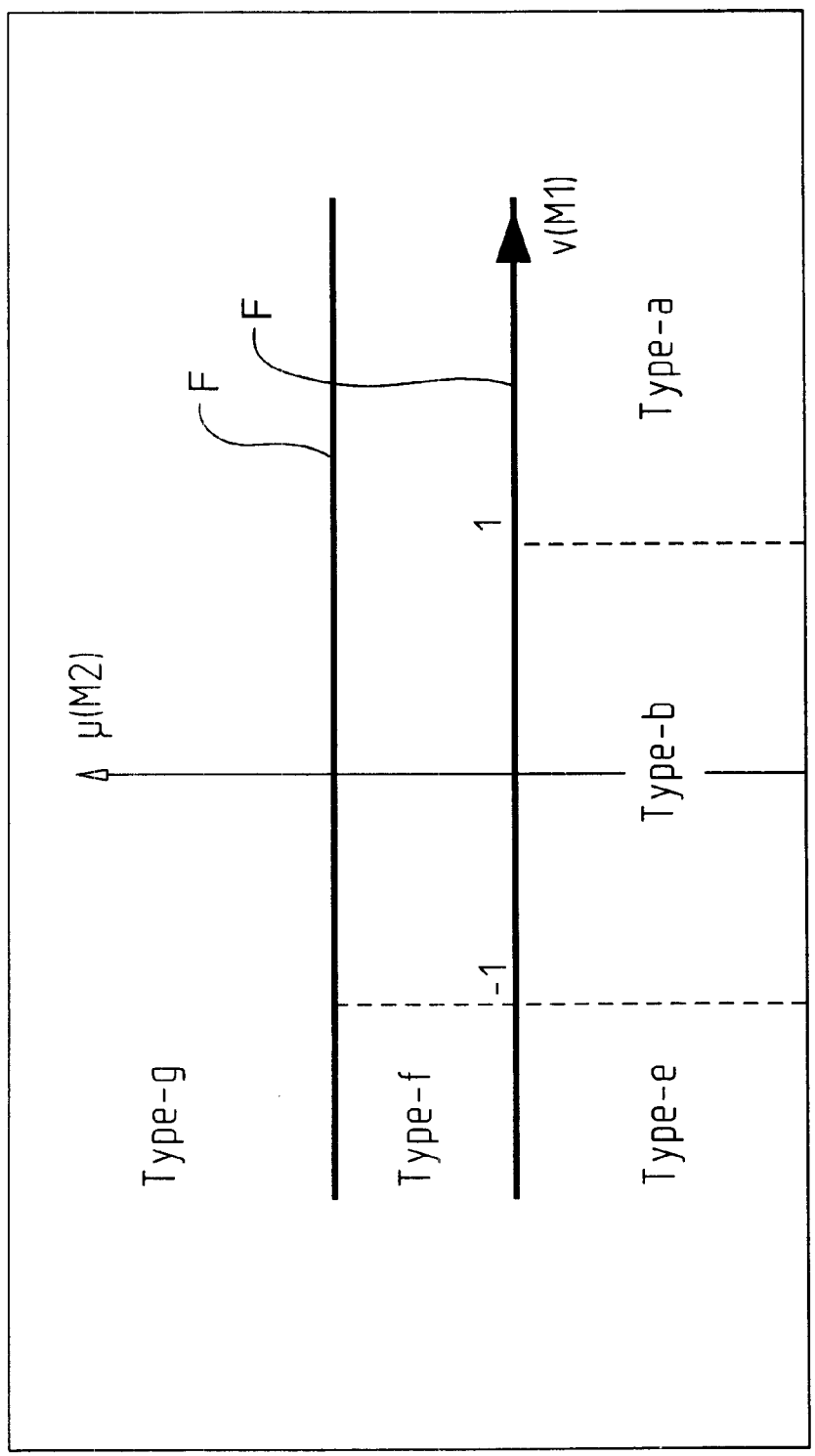
FIG. 1 is a schematic representation of the system classification used in the invention.

As shown in FIG. 1, type-a, type-b and type-e are topologically connected components of the two-dimensional parameter space. Therefore type-a, type-b, and type-e objectives can be transformed continuously into each other. In contrast, this is not possible between each of the two other classes of the three systems shown in FIG. 1. The class including types-a, -b, and -e, can not be continuously transformed into the type-f class (system) or the type-g class (system). FIG. 1 indicates the forbidden regions F in which, in the case of a finite NA, obscuration of the light beam by the mirror will occur and therefore the objectives will fail to image properly.

The particular topologically-connected component region is determined by $\mu$(M2). The annular field systems disclosed in U.S. Pat. No. 5,315,629 and EP 480,617 are type-a systems. Type-b systems provide continuous transition to the type-e system which also include the system known from Donald W. Sweeney et al., 23rd International Symposium of Microlithography. Type-a, type-b, and type-e systems are known in the prior art.

Systems of type-f and type-g are not known from any of the publications referred to above. The systems according to type-f and type-g differ from the systems of U.S. Pat. No. 5,315,629 and EP 480,617 by having a convex primary mirror. The system disclosed in Donald W. Sweeney et al., 23rd International Symposium of Microlithography, loc. cit., has a convex primary mirror but it also has a different angular magnification $\mu$ at M2 and thus a different optical path in the system, which does not overcome the prior art problems described above.

Systems of type-f with v(M 1) above approximately −1.5 lead to large chief ray angles on the reticle and to large system diameters. As a result, sensible system design with a concave M1, i.e. $v(M1) \geq 1$, is difficult.

In the following Table II, typical functional data are given for some of the embodiments of the various system categories. The distortion values follow from the magnification correction through the annular field. Objective systems belonging to the individual system classes are shown in FIGS. 2–5.

TABLE II

|  | type-f (94) | type-g (68) |
|---|---|---|
| M1 | convex | convex |
| v(M1) | −2.4 | −2.9 |
| $\mu$(M2) | 0.6 | 1.6 |
| NA | 0.1 | 0.1 |
| Red | 4x | 4x |
| annular field [mm$^2$] | 26.0 × 1.0 | 26.0 × 1.25 |
| mean annular field radius [mm] | 25 | 51 |
| OO' [mm] | 1368 | 1112 |
| FWD [mm] | 92 | 62 |
| CRAO [mm] | ϵ[−2.1, −2.0] | ϵ[4.1, 4.2] |
| CRA [mrad] | ϵ[−0.35, −0.50] | ϵ[−0.2, 0.2] |
| max. asph. [$\mu$m] | 19.6 | 8.3 |
| AOI max. [deg] | 14.1 | 22.0 |
| ΔAOI max. [deg] | ±2.5 | ±2.8 |
| WFE max. [λrms] | 0.029 | 0.025 |
| distortion [nmPV] | 7 | 30 |

Explanation of the abbreviations used in Table II are listed in Table III, below.

TABLE III

|  | Meaning |
|---|---|
| M1 | form of the primary mirror |
| v(M1) | "conversion ratio" according to Korsch |
| $\mu$(M2) | "angular magnification" according to Korsch |
| NA | image-side numerical aperture |
| Red | reduction factor = −1/imaging scale |
| annular field [mm$^2$] | secant length × annular width in the image field |
| mean annular field radius [mm] | image field radius in the middle of the annular field |
| OO' [mm] | object-image distance |
| FWD [mm] | optically free working distance on the image side |
| CRAO [deg] | chief ray angle in the object space |
| CRA [mrad] | chief ray angle in the image space |
| max. asph. [$\mu$m] | maximum deviation of the asphere from the best fitting sphere with respect to the used region of the mirror |
| AOI max. [deg] | maximum angle of incidence |
| ΔAOI max. [deg] | variation of the angle of incidence over the mirror |
| WFE max. [λrms] | maximum rms wavefront error in units of λ |
| distortion [nmPV] | peak-to-peak value over the annular field scale-corrected chief ray distortion |

Systems with a convex M1, i.e. primary mirror, show a significantly higher asphericity than the type-a designs with a concave M1.

Figure 2:
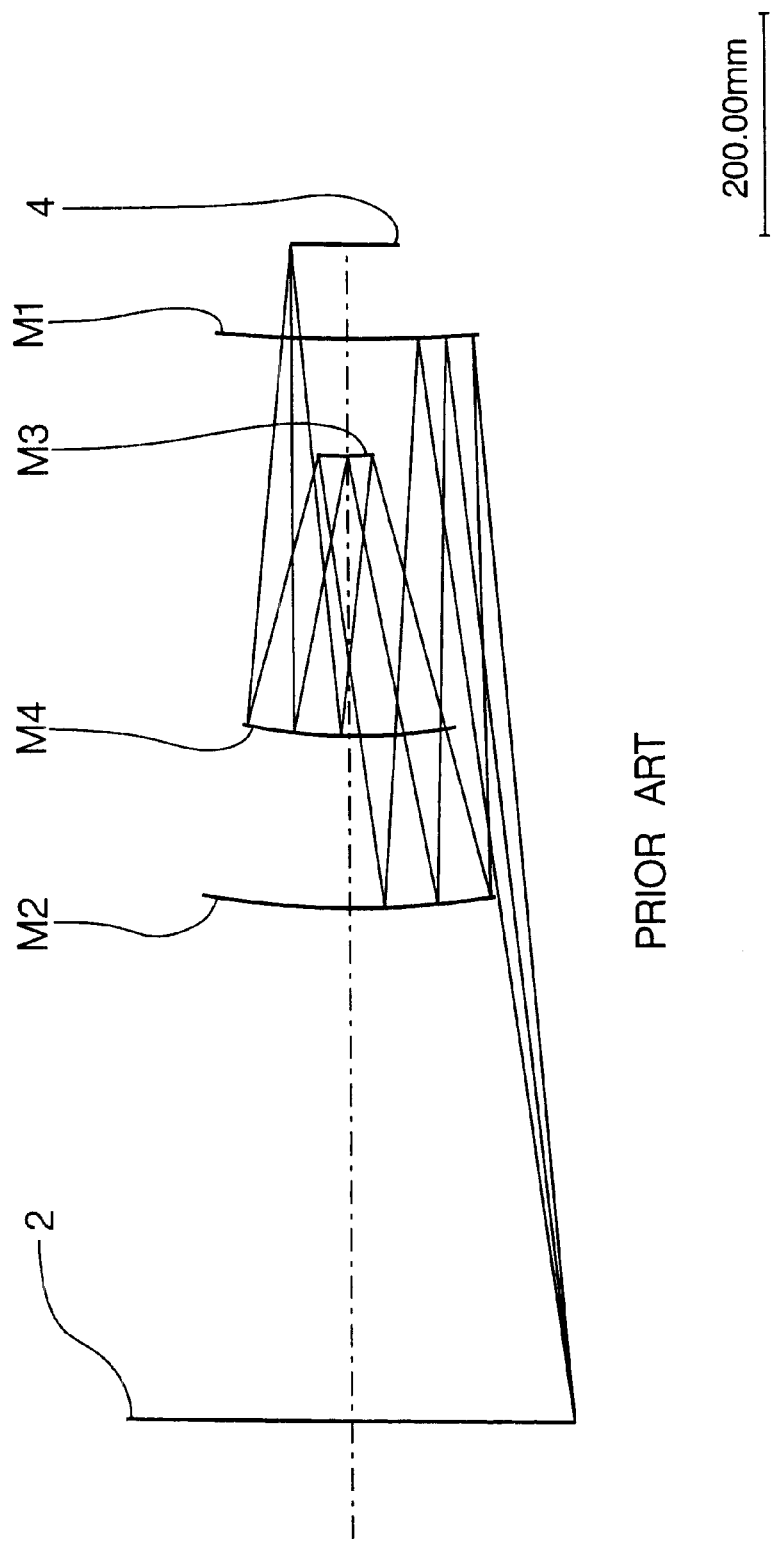
FIG. 2 is a lens cross-section of a first four-mirror system (type-e system) according to the prior art.

FIG. 2 shows a cross-section of a type-e system from a reticle plane 2, or mask, to a wafer plane 4. The mirror nearest to the wafer is the first mirror M1. Type-e systems have the lowest AOI and ΔAOI on mirrors M1, M2, M3, M4, which favors the polarization-optical properties of the system. However, the high chief ray angles on the reticle plane 2 requires plane reticles. Conversely, type-g systems, as shown in cross-section in FIG. 4, have relatively large AOI and ΔAOI on mirrors M1, M2, M3, M4 with tolerable chief ray angles on the reticle.

Figure 3:
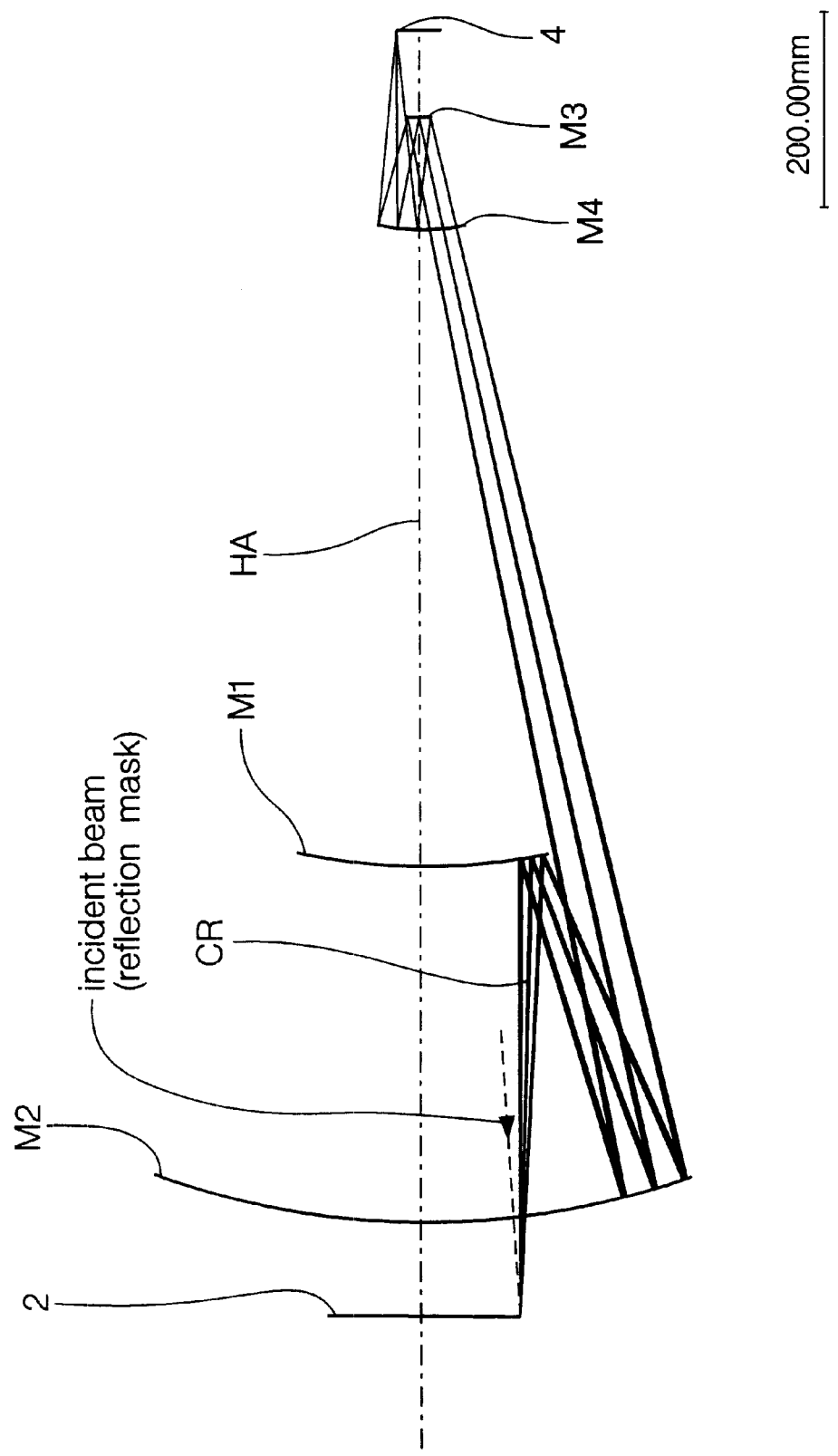
FIG. 3 is a lens cross-section of a four-mirror system (type-f system) according to the invention.

As shown in FIG. 3, type-f systems require the largest aspherical elements, but have favorable angular distributions on mirrors M1, M2, M3, M4 and on the reticle 2. The low distortion results in a relatively small image field. Although the constructional length, i.e. the physical length, of the system is larger than in the other systems, the long drift sections within the objective permit the optional use of additional components, such as an alignment system, deflecting mirror, etc. A chief ray CR and an optical axis HA are also shown in FIG. 3.

Figure 4:
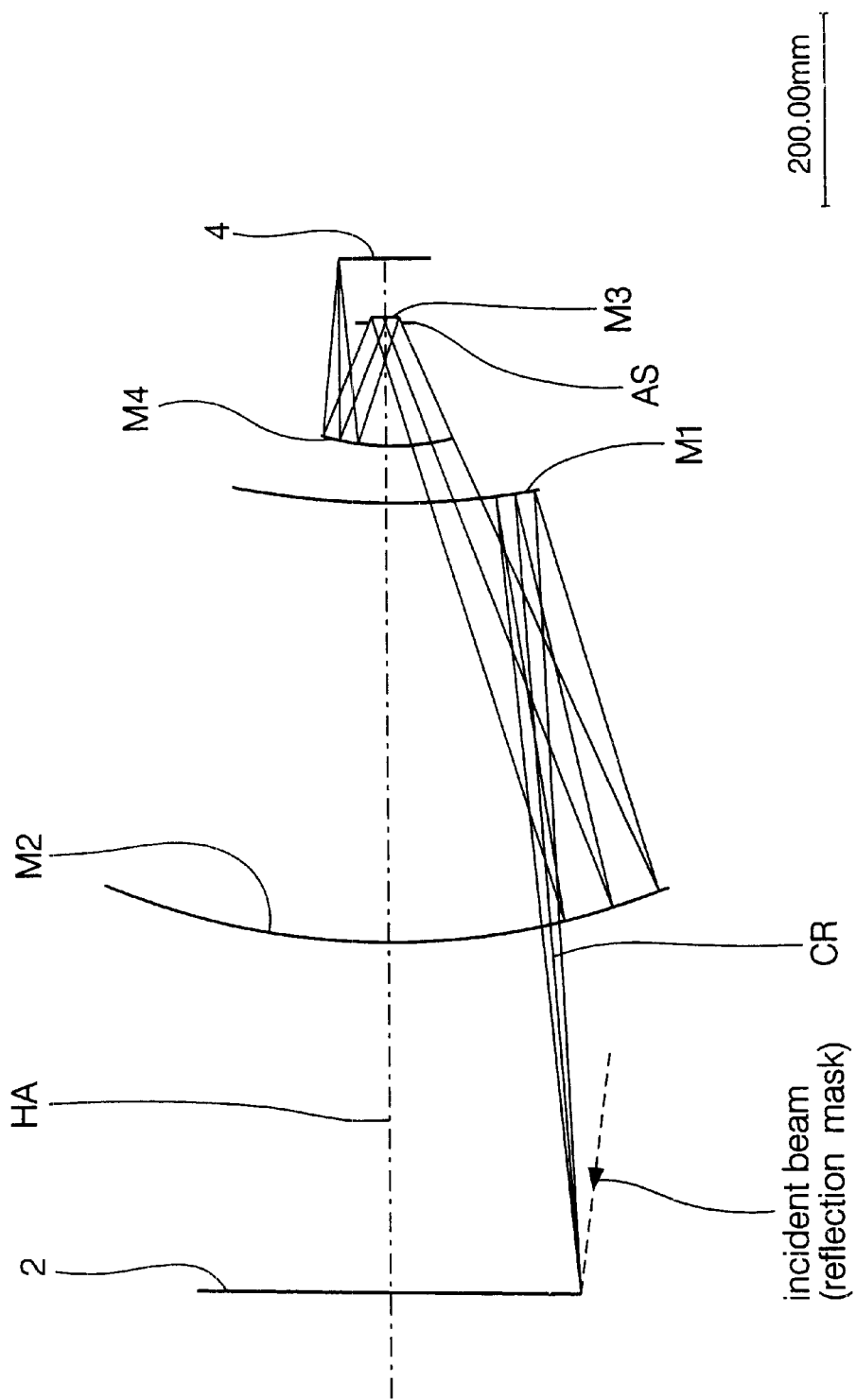
FIG. 4 is a lens cross-section of another four-mirror system (type-g system) according to the invention.

The type-f and type-g systems, as shown in FIGS. 3 and 4, respectively, can be realized with positive and negative chief ray angles on reticle 2. Thus, an optimal geometry can be selected, especially a comparatively low free working distance to reticle 2, for imaging the light when using a reflection mask. Furthermore, when using a transmission mask, a telecentric beam path can be realized.

Figure 5:
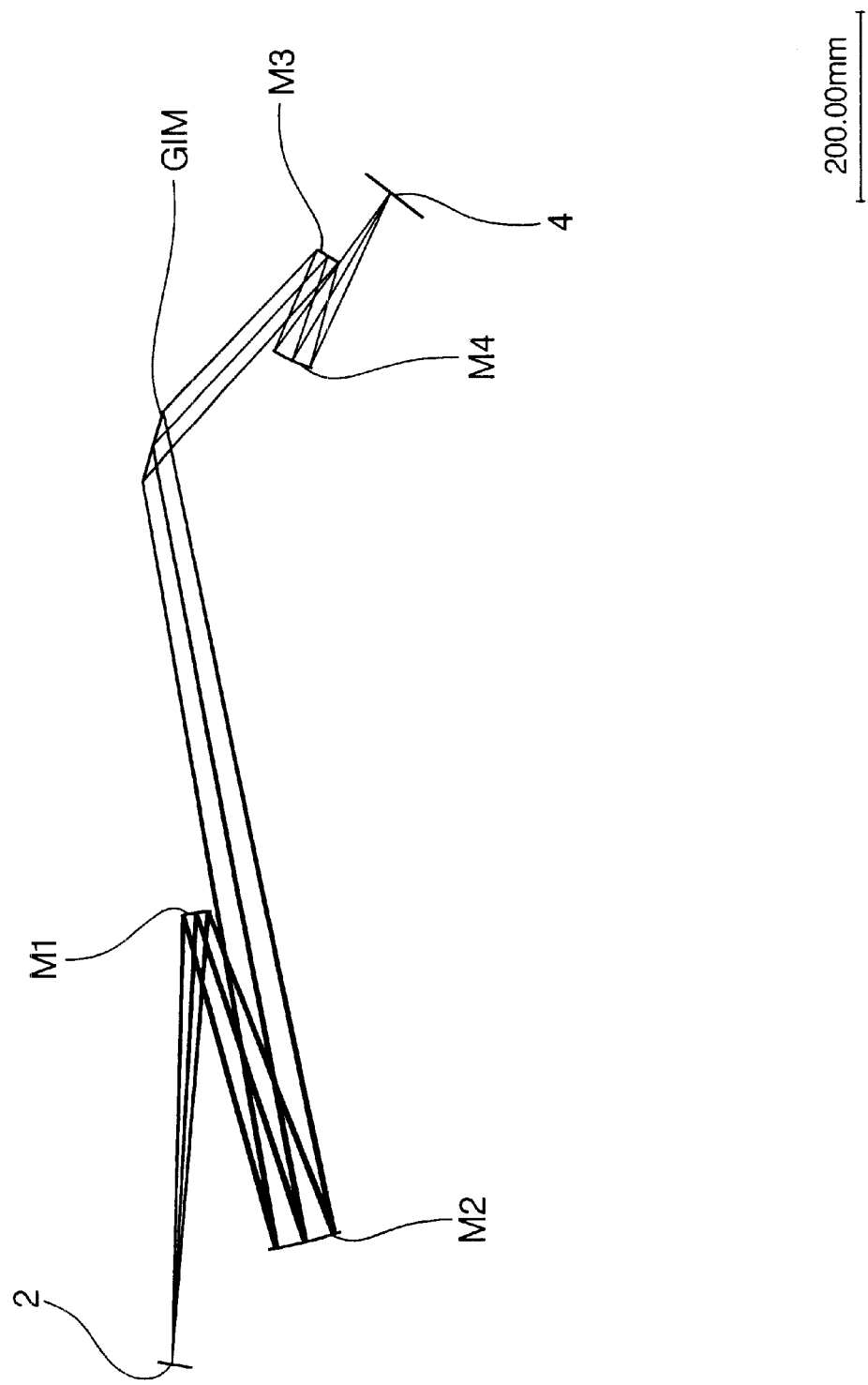
FIG. 5 is a lens cross-section of type f with an introduced grazing incidence mirror according to the invention.

The systems of type-a and type-f have relatively long "drift sections" before or within the actual image system. Therefore, it is possible to introduce grazing-incidence mirrors of high reflectivity as correction elements. These correction elements can include Schmidt corrector-type elements or an active optical correction system. Based on known values for molybdenum-coated mirrors; it is theoretically possible to achieve approximately 85% reflectivity of non-polarized incident light of wavelength 13.3 nm incident at an angle of 75°. Due to the grazing incidence of the beam, the illuminated part of the mirror can be made very large in one direction, in comparison to that on the neighboring mirror, which facilitates the design of the correcting elements. Preferably, the individual mirrors are designed in a pair-wise manner with the normals to the surface being almost perpendicular to one another, in order to be able to manipulate the beams in all spatial directions with the same resolution. FIG. 5 shows such a design of type-f with an introduced grazing-incidence mirror GIM.

The parameters of the system according to FIG. 3 in the code V format are given in Table 1 below.

TABLE 1

Type-f (94) 4 x/0.10    1.0 mm annular field

| ELEMENT NUMBER | RADIUS | THICKNESS | DIAMETER | TYPE |
|---|---|---|---|---|
| OBJECT | INF | 0.000 | 204.000 | |
| | | 100.228 | 217.084 | |
| | | 380.421 | | |
| M1 | A(1) | −380.421 | 264.271 | REFL. |
| M2 | A(2) | 380.421 | 563.054 | REFL. |
| | | 796.185 | 390.422 | |
| | | APERTURE-STOP | 23.764 | |
| M3 | A(3) | −117.68 | 23.764 | REFL. |
| M4 | A(4) | 117.968 | 92.608 | REFL. |
| | | 284.465 | 71.790 | |
| | | | 89.622 | |
| IMAGE | IMAGE WIDTH = INF. | −192.945 | 50.989 | |

Aspherical Constants:

$$Z = \frac{(CURV)Y^2}{1 + (1 - (1+K)(CURV)^2 Y^2)^{1/2}} + (A)Y^4 + (B)Y^6 + (C)Y^8 + (D)Y^{10}$$

| Asphere | CURV | K | A | B | C | D |
|---|---|---|---|---|---|---|
| A(1) | 0.0014137 | −4.643893 | 0.00000E − 00 | −6.97355E − 15 | 7.87388E − 20 | 0.00000E + 00 |
| A(2) | 0.0011339 | −0.232793 | 0.00000E + 00 | −5.35926E − 17 | 3.35875E − 23 | 0.00000E + 00 |
| A(3) | 0.0040246 | 6.006678 | 0.00000E − 00 | 3.76117E − 13 | −1.43488E − 15 | 0.00000E + 00 |
| A(4) | 0.0042162 | 0.289323 | 0.00000E + 00 | 8.76473E − 15 | −5.59142E − 19 | 0.00000E + 00 |

Reference wavelength = 13 nm

Similar to Table 1 above, the constructional data of the type-g system shown in FIG. 4 can be seen in the following Table 2:

TABLE 2

| ELEMENT NUMBER | RADIUS | THICKNESS | DIAMETER | TYPE |
|---|---|---|---|---|
| OBJECT | INF | 0.000 | | |
| | | | 413.000 | |
| | | 378.925 | | |
| | | | 373.642 | |
| | | 474.629 | | |
| M1 | A(1) | −474.629 | 327.612 | REFL. |
| M2 | A(2) | 474.629 | 600.624 | REFL. |
| | | | 206.075 | |
| | | 196.627 | | |
| | | APERTURE-STOP | 28.266 | |
| M3 | A(3) | −136.037 | 28.266 | REFL. |
| M4 | A(4) | 136.037 | 141.438 | REFL. |
| | | | 115.807 | |
| | | −196.627 | | |
| | | | 155.535 | |
| | | 160.000 | | |
| | IMAGE WIDTH = | 98.781 | | |
| IMAGE | INF. | | 103.302 | |

| Aspherical Constants | CURV | K | A | B | C | D |
|---|---|---|---|---|---|---|

TABLE 2-continued

| | | | | | | |
|---|---|---|---|---|---|---|
| A(1) | 0.0010894 | −0.738027 | 0.00000E+00 | 3.65218E−16 | −1.37411E−20 | 0.00000E+00 |
| A(2) | 0.0012023 | 0.031851 | 0.00000E−00 | 1.38321E−17 | −6.58953E−23 | 0.00000E+00 |
| A(3) | 0.0036931 | 1.579939 | 0.00000E+00 | −1.26703E−13 | 3.53973E−16 | 0.00000E+00 |
| A(4) | 0.0035917 | 0.316575 | 0.00000E+00 | 3.15592E−15 | 1.74158E−19 | 0.00000E+00 |
| Reference Wavelength | 13.0 nm | | | | | |

If a grazing incidence, deflecting mirror GIM is introduced between mirrors M1, M2 and M3, M4, then one obtains the structure of type-f shown in FIG. 5. The data for this embodiment can be seen in Table 3.

TABLE 3

Type-f(xx) 4x/0.10 1.0 mm annular field

| ELEMENT NUMBER | RADIUS | THICKNESS | DIAMETER | TYPE |
|---|---|---|---|---|
| OBJECT | INF | 0.000 | | |
| | | | 204.000 | |
| | | 100.000 | | |
| | | | 217.065 | |
| | | 380.407 | | |
| M1 | A(1) | −380.407 | 264.287 | REFL. |
| M2 | A(2) | 380.407 | 563.152 | REFL. |
| | | | 390.481 | |
| | | 296. 123 | | |
| | DECENTER (1) | | | |
| GIM | INF | −499.995 | 536.341 | REFL. |
| | | APERTURE STOP | 23.757 | |
| M3 | A(3) | 117.968 | 23.757 | REFL. |
| M4 | A(4) | −117.968 | 92.614 | REFL. |
| | | | 69.580 | |
| | | −284.465 | | |
| | IMAGE WIDTH = | 192.994 | | |
| IMAGE | INF. | | 51.000 | |

| Aspherical Constant N | CURV | K | A | B | C | D |
|---|---|---|---|---|---|---|
| A(1) | 0.0014140 | −4.643296 | 0.00000E+00 | −96.99186−15 | 7.89877E−20 | 0.00000E−00 |
| A(2) | 0.0012023 | 0.031851 | 0.00000E−00 | 1.38321E−17 | −6.58953E−23 | 0.00000E+0 |
| A(3) | 0.0012023 | 1.579939 | 0.00000E+00 | −1.26703E−13 | 3.5973E−16 | 0.00000E+0 |
| A(4) | −0.0042169 | 0.289286 | 0.00000E+00 | −8.76770E−15 | 5.47269E−19 | 0.00000E+00 |
| DECENTER CONSTANTS DECENTER | | | Deflection Angle ALPHA AM GIM | | | |
| D(1) | | | 75.00000 Degree | | | |
| Wavelength 13 nm | | | | | | |

Figure 6:
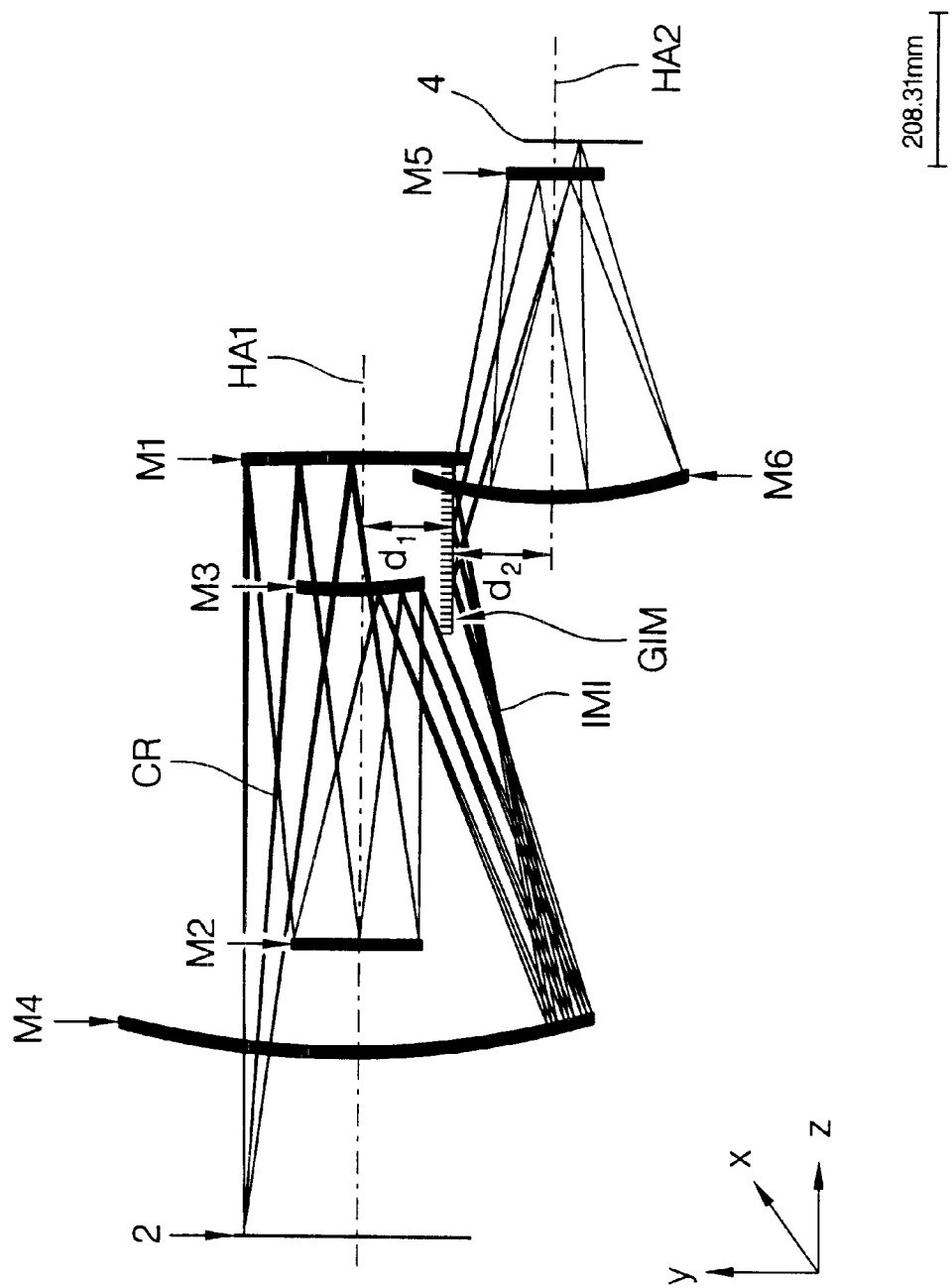
FIG. 6 is a lens cross-section of a system with six multilayer mirrors and a grazing incidence mirror.

In FIG. 6 another embodiment of the invention is shown. The projection objective comprises reticle 2 in the object plane. The system is telecentric in the image plane, i.e., the wafer plane 4. A first set of multilayer mirrors comprises the mirrors M1, M2, M3 and M4 in centered arrangement to a first optical axis HA1, and a second set of multilayer mirrors comprises the mirrors M4 and M5 in centered arrangement to a second optical axis HA2. The mirror M4 has a positive chief ray angular magnification. The grazing incidence mirror GIM is arranged such that the first optical axis HA1 is parallel to the second optical axis HA2. The projection objective system comprises an intermediate image IM1 between the fourth and fifth mirror.

The grazing incidence mirror GIM is disposed near the intermediate image. Since near the intermediate image the ray bundle has only a small extension, the grazing incidence mirror can be chosen small in size.

Preferably the grazing incidence mirror is arranged in the system, such that the distance $d_1$ from the first optical axis HA1 to the grazing incidence mirror is equal to the distance $d_2$ from the second optical axis HA2 to the grazing incidence mirror.

Furthermore in FIG. 6 a system of coordinates is shown. The z-direction is parallel to the optical axes HA1, HA2. The y-direction is perpendicular to the z-direction and lies in the plane of the figure. The x-direction is perpendicular to the z- and the y-direction. In such a coordinate system the projection objective according to FIG. 6 has a positive linear magnification in the x-direction, and due to the grazing incidence mirror GIM, the system has negative linear magnification in y-direction.

The projection objective according to FIG. 6 provides for a large distance between the object plane and the first mirror and thus for small reflection angles in the object plane. The data of the system according to FIG. 6 in Code-V-format are apparent from Table 4:

TABLE 4

6 mirror-system with addition grazing incidence mirror

| Element Number | Radius | Thickness | Diameter | Type |
|---|---|---|---|---|
| Object | INF | 1060.0000 | | |
| 1 | A(1) | −652.9611 | 284.1884 | REFL |
| | | Aperture Stop | 155.8959 | |
| | | 0.0000 | | |
| 2 | A(2) | 472.9611 | 156.3900 | REFL |
| 3 | A(3) | −620.5240 | 159.1868 | REFL |
| 4 | A(4) | 680.4920 | 577.1214 | REFL |
| | DECENTER(1) | | | |
| 5 | INF | −80.9306 | 232.9061 | REFL |
| | DECENTER(2) | −427.9379 | 251.8960 | |
| | DECENTER(3) | | | |
| 6 | A(5) | 427.9379 | 107.6545 | REFL |
| 7 | A(6) | −479.1014 | 333.2079 | REFL |
| IMAGE | INF | | 70.9994 | |

Aspheric Constants $$Z = \frac{(CURV)Y^2}{1 + (1 - (1 + K)(CURV)^2 Y^2)^{1/2}} + (A)Y^4 + (B)Y^6 + (C)Y^8 + (D)Y^{10}$$

| Aspherical Constant N | CURV | K | A | B | C | D |
|---|---|---|---|---|---|---|
| A(1) | 0.00034830 | 3.659681 | 0.00000E + 00 | 1.32325E − 15 | 6.23099E − 22 | 0.00000E − 00 |
| A(2) | 0.00081769 | 1.117921 | 0.00000E + 00 | −5.02192E − 15 | −4.822269E − 20 | 0.00000E + 00 |
| A(3) | 0.00208391 | 0.843622 | 0.00000E + 00 | 7.65748E − 14 | −2.37306E − 19 | 0.00000E + 00 |
| A(4) | 0.00104477 | −0.865338 | 0.00000E + 00 | 1.25916E − 15 | −3.29529E − 21 | 0.00000E + 00 |
| A(5) | −0.00186127 | 11.590049 | 0.00000E + 00 | 3.16061E − 13 | 1.45186E − 17 | 0.00000E + 00 |
| A(6) | 0.00184285 | 0.106589 | 0.00000E + 00 | −2.10598E − 16 | −1.32532E − 21 | 0.00000E + 00 |

DECENTERING CONSTANTS

| Decenter | X | Y | Z | Alpha | Beta | Gamma |
|---|---|---|---|---|---|---|
| D(1) | 0.0000 | −120.000 | 0.0000 | 90.0000 | 0.0000 | 0.0000 (BEND) |
| D(2) | 0.0000 | 120.000 | 0.0000 | 0.0000 | 0.0000 | 0.0000 |
| D(3) | 0.0000 | 0.0000 | 0.0000 | 0.0000 | 0.0000 | 0.0000 |

DECENTERING CONSTANT KEY:

| Type | Trailing Code | Order of Application |
|---|---|---|
| DECENTER | | DISPLACE (X, Y, Z) TILT (ALPHA, BETA, GAMMA) REFRACT AT SURFACE THICKNESS TO NEXT SURFACE |
| DECENTER & BEND | BEND | DECENTER (X, Y, Z, ALPHA, BETA, GAMMA) REFLECT AT SURFACE BEND (ALPHA, BETA, GAMMA) THICKNESS TO NEXT SURFACE |

REFERENCE WAVELENGTH = 13.5 NM

FIG. 7 shows the four-mirror or six-mirror reduction objective of FIGS. 3, 4, or 6 with the reticle plane 2 as a transmission mask. Thus, it can be seen from FIG. 6 that the reduction objective is telecentric on the object side of such a configuration.

Similarly, FIG. 8 shows the four-mirror or six mirror reduction objective of FIGS. 3, 4, or 6 with reticle plane 2 as a reflection mask. In such a configuration, a beam splitter may be used, for example, to ensure the reduction objective is also telecentric on the object side.

Thus, the invention provides for a reduction objective with an imaging reduction scale of approximately 4× for use in soft X-ray, i.e., EUV and UV, annular field projection applications, such as lithography. The reduction objection achieves the necessary resolution at the required image field and provides a structural design with optical elements of sufficiently mild aspherecity, sufficiently small incident angles for the multilayered optics, and sufficiently large constructional space for the image carriers.

We claim:

1. A reduction objective with an image side and an object side, comprising:

a first set of multilayer mirrors in centered arrangement with respect to a first optical axis, and a second set of multilayer mirrors in centered arrangement with respect to a second optical axis situated between the image side and the object side; and an additional mirror disposed at grazing incidence such that said additional mirror defines an angle between said first optical axis and said second optical axis.

2. A reduction objective according to claim 1, wherein the first set of multilayer mirrors comprises a primary multilayer mirror and a secondary multilayer mirror.

3. A reduction objective according to claim 2, wherein the primary mirror is convex and the secondary mirror has positive chief ray angular magnification.

4. A reduction objective according to claim 2, wherein the second set of multilayer mirrors comprises a tertiary multilayer mirror and a quaternary multilayer mirror.

5. A reduction objective according to claim 4, wherein the primary mirror is convex and the secondary mirror has positive chief ray angular magnification.

6. A reduction objective according to claim 1, wherein said angle is 75°.

7. A reduction objective according to claim 1, wherein the first set of multilayer mirrors comprises a primary, a secondary, a tertiary and a quaternary multilayer mirror.

8. A reduction objective according to claim 7, wherein the second set of multilayer mirrors comprise a fifth and a sixth multilayer mirror.

9. A reduction objective according to claim 8, wherein the fifth mirror is convex and the sixth mirror is concave.

10. A reduction objective according to claim 8, wherein the first and the second optical axis are parallel to each other and said angle is 0°.

11. A reduction objective according to claim 10, wherein the grazing incidence mirror is disposed between the first optical axis and the second optical axis.

12. A reduction objective according to claim 10, wherein the objective is telecentric at the object side.

13. A reduction objective according to claim 10, wherein the objective is telecentric at the image side.

14. A reduction objective according to claim 8, wherein the reduction objective comprises a plane conjugate to the object plane in which an intermediate image of the object lies.

15. A reduction objective according to claim 14, wherein the grazing incidence mirror is disposed near the intermediate image of the object.

16. A reduction objective according to claim 8, wherein the quaternary multilayer mirror has positive chief ray angular magnification.

17. A reduction objective according to claim 8, wherein linear magnification of the reduction objective in an x-direction is positive and the linear magnification of the reduction objective in a y-direction is negative.

18. A projection exposure apparatus including a reduction objective with an image side and an object side for annular field scanning operation comprising:

a mask;

a first set of multilayer mirrors in centered arrangement with respect to a first optical axis and a second set of multilayer mirrors in centered arrangement with respect to a second optical axis situated between the image side and the object side; and an additional mirror disposed at grazing incidence such that said additional mirror defines an angle between said first optical axis and said second optical axis.

19. A method for integrated circuit fabrication using a projection exposure apparatus including a reduction objective, with an image side and an object side, comprising the steps of:

providing a mask;

providing a first set of multilayer mirrors in centered arrangement with respect to a first optical axis and a second set of multilayer mirrors in centered arrangement with respect to a second optical axis situated between the image side and the object side; and providing an additional mirror disposed at grazing incidence such that said additional mirror defines an angle between said first optical axis and said second optical axis.

* * * * *

UNITED STATES PATENT AND TRADEMARK OFFICE
CERTIFICATE OF CORRECTION

PATENT NO. : 6,577,443 B2
DATED : June 10, 2003
INVENTOR(S) : Dinger et al.

It is certified that error appears in the above-identified patent and that said Letters Patent is hereby corrected as shown below:

<u>Title page,</u>
Item [75], Inventors, please correct inventorship to include the following inventors:

-- Udo Dinger;
Hans-Jürgen Mann; and
Dr. Wolfgang Singer --
Item [30], please change the application number for the Foreign Application Priority Data from "19324442" to -- 19824442 --.

Signed and Sealed this

Twenty-third Day of December, 2003

JAMES E. ROGAN
*Director of the United States Patent and Trademark Office*